United States Patent [19]

White

[11] 4,431,937
[45] Feb. 14, 1984

[54] PIEZOELECTRIC CRYSTAL ASSEMBLY INCLUDING PROTECTIVE MOUNTING AND COVERING MEANS

[75] Inventor: Maurice Y. White, Spring Hill, Kans.

[73] Assignee: SFE Technologies, San Ferando, Calif.

[21] Appl. No.: 314,576

[22] Filed: Oct. 26, 1981

[51] Int. Cl.³ .............................. H01L 41/22
[52] U.S. Cl. .................. 310/344; 310/340; 310/353; 310/369
[58] Field of Search ............ 310/320, 340, 344, 346, 310/354, 356, 365–367, 369, 348, 353, 312; 357/74

[56] References Cited

U.S. PATENT DOCUMENTS

| | | | |
|---|---|---|---|
| 2,794,132 | 5/1957 | Zapponi | 310/340 |
| 2,824,219 | 2/1958 | Fisher et al. | 310/353 |
| 2,877,362 | 3/1959 | Tibbetts | 310/344 |
| 3,622,816 | 11/1971 | McGrew | 310/312 |
| 3,747,176 | 7/1973 | Toyoshima | 29/25.35 |
| 4,017,752 | 4/1977 | Kakehi et al. | 310/340 |
| 4,103,264 | 7/1978 | Howatt et al. | 333/72 |
| 4,293,890 | 10/1981 | Varsane | 361/310 |

FOREIGN PATENT DOCUMENTS

45-9343 4/1970 Japan .................... 310/320

Primary Examiner—J. D. Miller
Assistant Examiner—D. L. Rebsch
Attorney, Agent, or Firm—Schmidt, Johnson, Hovey & Williams

[57] ABSTRACT

An improved construction for piezoelectric crystal assemblies has significant advantages both from the standpoint of operational attributes of the finished product and of adaptability to being mass produced in an expeditous and economical manner. A related, improved method of making piezoelectric crystal assemblies, including those of the aforementioned improved construction, is also provided, which similarly has significant advantages from the standpoints of speed and economy.

14 Claims, 22 Drawing Figures

PIEZOELECTRIC CRYSTAL ASSEMBLY INCLUDING PROTECTIVE MOUNTING AND COVERING MEANS

BACKGROUND OF THE INVENTION

1. Field of the Invention

This invention relates to the field of piezoelectricity and, more particularly, to an improved construction for and improved method of manufacturing piezoelectric crystal assemblies of the general class used for frequency controlling purposes in radio equipment, television equipment and diverse other types of electronic equipment.

2. Description of Prior Art

Generally speaking, piezoelectric crystal assemblies include a crystal element cut or formed from quartz or other piezoelectrically active material into a relatively thin circular disc or rectangular plate having opposed major faces, electrically conductive electrode structures respectively mounted upon or otherwise held in engagement or close proximity with the major faces of the crystal element, some form of protective housing or cover, and some means for supporting the crystal element (and the electrode structures, if they are not secured to the crystal element) within the protective housing or cover in a manner that will not interfere with or unduly damp the desired resonantly vibratory motion of the crystal element.

Until about the 1930's, piezoelectricity was largely treated as a laboratory phenomenon, and those crystal assemblies that existed were relatively crude and typically characterized by the whims of the particular experimenters who built them or the materials that they may have had readily available for such purpose.

As the commercial, military and marine useage of radio communications developed and expanded, however, the advantages of employing the resonance properties of piezoelectric crystals for more stably controlling the frequency of oscillation of the electronic oscillators being incorporated into the exciter stage of radio transmitters and the like spawned a need for the availability in commercial quantities of more reliable and less individualistic types of piezoelectric crystal assemblies. At that time, quartz crystal elements of "cuts" (from a natural mother crystal) adapted to vibrate in longitudinal or other modes now considered non-optimum for most purposes were popular and were fabricated in the form of rectangular plates typically having major dimensions approaching one inch or more. Accordingly, the electrode structures were then usually implemented as electrically conductive metal plates pressed into contact with the major surfaces of the crystal element by some form of metallic spring means through which electrical connections with the electrodes could also be established. One such early construction employed a base and an integral housing frame thereon of electrically insulative material such as bakelite, a rectangular aperture through the frame for receiving the crystal element and a pair of shiftable metal electrode plates respectively contacting the major faces of the crystal element therebetween, a metal side wall mounted on each side of the frame, metal compression springs between at least one of the side walls and the adjacent shiftable electrode plate, and a pair of terminal pins carried by the base and suitably coupled with the electrodes via the springs or otherwise.

Further development of piezoelectric crystal assemblies then evolved along lines including the employment of thin electrically conductive metal coatings deposited in adhering relationship upon the major faces of the crystal element to take the place of separate electrode structures, the supporting of the crystal element by means of wires directly connected to the deposited electrode coatings, and increased usage of so-called "thickness shear" vibrating quartz elements (such as those commonly referred to as "AT" and "BT" cuts) in order to take advantage of the higher resonance frequency characteristics and the greater frequency/temperature stability characteristics of those types of quartz crystal elements. The trend toward almost universal employment of such thickness shear vibrating crystal elements was attended by somewhat differing considerations applicable to the packaging thereof into crystal assemblies, than had been the case for the earlier crystals that vibrated in longitudinal, flexure or other modes. First, it was found that thickness shear mode type quartz crystal elements would operate efficiently when fabricated with much smaller dimensions than had been required for the types of crystal elements earlier utilized. Secondly, it was found that the thickness shear mode type crystal elements could most advantageously be fabricated in the form of circular discs. Thirdly, since the nodal areas of a thickness shear mode vibrating type crystal element are different than for the types of crystal elements earlier utilized (the piezoelectric activity of primary utility in a thickness shear mode type crystal element being at the central areas of the major faces thereof), and since it is necessary for greatest piezoelectric efficiency for a crystal element to be supported at areas thereof which are either nodal or relatively inactive from the vibratory standpoint (adjacent the edge of a disc type thickness shear mode element and, if of a relatively large diameter, preferably also adjacent the central thickness plane thereof), techniques for supporting the thickness shear crystal elements needed to be altered from those previously employed for the earlier types of crystal elements.

Accordingly, essentially from the beginning of widespread usage of disc type thickness shear mode crystal elements, the electrode structures employed therewith have typically been of the deposited metallic coating type. The approach initially employed in the supporting of such crystals commonly utilized the wires that were connected to the electrode coatings for electrical purposes for also providing physical support for the crystal element itself, such wires in turn typically being soldered to terminal pins in a non-conductive base, with a hollow cap of metal being mounted on the base to provide a protective enclosure for the crystal element. Since the early practice of supporting thickness shear mode type crystals by wires directly connected with the deposited electrode coatings thereon caused some damping of the vibratory action of the crystal element by virtue of the physical connections made therewith at the areas of primary piezoelectric activity of such crystals, the electrode coatings were soon thereafter provided with intergrally deposited tab portions extending radially outwardly from the main circular central portion of each electrode coating toward the edge of the crystal disc, in order that both the required electrical connections to the electrodes and physical support for the crystal element could be provided adjacent the more nodal edge area of the crystal element.

The housings in which such thickness shear mode crystal elements were packaged then evolved along essentially two lines. One approach was to continue the use of an electrically insulative base carrying a pair of terminal pins to which a pair of connecting and supporting wires would be respectively fastened, with such wires then being soldered or otherwise attached to the extension tabs of the electrode coatings adjacent the edge of the crystal element, and with a cap of metal or the like mounted on the base and sometimes hermetically sealed to the latter for protectively enclosing the crystal element. The other approach, which ultimately became the more dominant, involved various constructions essentially employing a central annular sleeve of electrically insulative material within which the crystal element was received and supported by means of metallic caps mounted on both sides of the sleeve and having some means, such as separate springs or resilient fingers on the caps, for oppositely engaging the crystal element adjacent the edge of its major faces, including the marginal portion thereof to which the radial tab portions of the electrode coatings extended for effecting electrical connections therewith. In order to provide moisture-proofing in the last mentioned type of assembly, it then became accepted practice to encapsulate the crystal element housing with a layer of hardened epoxy material from which only the electrical connecting leads secured to the end caps protruded.

The McGrew U.S. Pat. No. 3,622,816, issued to a predecessor of the assignee of this patent, discloses the last mentioned type of crystal assembly, which it is believed can be fairly regarded as representing essentially the preferred state of the art construction for crystal assemblies existing and prevalent as a matter of commercial practice prior to the present invention.

Despite the fact that the piezoelectric crystal assembly construction provided by the McGrew patent has proved to be highly satisfactory from the operational standpoint, it will be observed from the disclosure of that patent that the construction contemplated thereby requires fabrication and proper assembly of a number of separate structural parts. Accordingly, especially in view of the fragile nature of the quartz crystal elements employed and the miniaturized nature of all of the structural components involved, it will be appreciated that the fabrication and assembly of such devices has remained relatively time consuming and relatively costly, with many operations being involved which are of nature heretofore regarded as requiring individualized attention by skilled personnel for each unit to be produced. It will also be appreciated that the number and nature of the structural parts and the manner in which they must be fabricated and assembled for each unit produced with such constructions tends to render the maintenance of proper quality control and uniformity a significant task, particularly in view of the large quantity of piezoelectric assemblies that are now required to satisfy the demands for such assemblies for use in television receivers and many other types of equipment.

These, then, are the primary practical problems characterising the state of the prior art to whose solution the present invention is directed, while at the same time also providing improvements from the operational and reliability standpoints.

The other known prior art disclosures which may be of some incidental interest in connection with certain details of the construction involved in the present invention are U.S. Pat. Nos. 3,656,217 and 3,849,681 showing the use of wires or rods having forked or bifurcated ends for making both electrical and physical supporting connections with a crystal element; U.S. Pat. Nos. 3,747,176, 4,017,752 and 4,103,264 showing a technique for providing a pocket of air or gas surrounding an encapsulated crystal element in which the crystal element is initially covered with a heat dissipatable material, then encapsulated, and then heated to cause the material to dissipate or be reduced to gaseous form in a pocket adjacent the crystal element within the encapsulation body; and published Japanese Patent Application 124,981 of Ishibashi et al, filed Oct. 16, 1975, Publication No. 48489/77, apparently relating to a crystal assembly employing a rectangular "porcelain" crystal element of the longitudinal or flexure mode type having deposited electrodes and supported at end portions of one face thereof upon a larger rectangular base of insulative material provided with conductive pads for contacting the electrodes, in which an air containing bag is formed around the entire element and base assembly by heat welding the edges of a pair of thermoplastic sheets between which it is sandwiched, with such bag then being covered with an outer hardened encapsulation layer.

Insofar as is known, however, neither prior practices nor prior disclosures of others have either taught or suggested the improved construction or method of manufacture provided by this invention.

SUMMARY OF THE INVENTION

This invention improves over prior practices, essentially by optimization through simplification, respecting both the structural aspects of piezoelectric crystal assemblies and the steps necessary to mass-produce the same. The number of parts employed is reduced to a minimum, and the parts are made of materials and configurations facilitating fabrication and assembly. Similarly, the manufacturing process has been reduced to a minimum number of operations of nature that can feasibly be performed with a high degree of efficiency and concurrent handling of a plurality of units on a batch basis. The improved method will also be perceived to be highly amenable to mechanization and to reduce the amount of attention needed from highly skilled personnel.

The results achieved include not only significantly increased speed of production and lower manufacturing costs, but also crystal assembly products of greater uniformity, more consistent quality and enhanced reliability of operation. Among the more subtle advantages of the improved construction are its adaptability to crystal elements of various sizes without alteration of the basic manufacturing procedures, significant reduction of the volume or space requirements of the finished assembly to a virtual minimum for the particular size of crystal element employed, unexpectedly enhanced resistance to external shock or vibration as compared with conventional assemblies using springs or the like for supporting the crystal element, etc. Various of such advantages are significantly interrelated; for example, whereas conventional crystal holder constructions using resilient supports for the crystal element must allow for possible movement of the element within the holder under the influence of external shock or vibration, the crystal element in the improved construction of this invention is more positively held in place relative to the structure by which it is enclosed-thus, whereas the conventional assemblies are required to provide extra clearance between the crystal element and adjacent wall structures by which it might be engaged and damaged under the influence of such external factors, the construction of the present invention permits the clearance between the major faces of the crystal element and the adjacent wall structure to be reduced to that bare minimum required to accommodate the piezoelectric vibratory movement of the crystal element itself (which is of the order of microinches), thereby permitting the volume or space requirements of the improved construction to be drastically reduced to a fraction of what is required with prior conventional constructions (which minimization of space requirements is becoming increasingly important as piezoelectric crystal assemblies are more and more widely being employed in printed circuit board type modules).

Further details of both the improved construction and the improved method for making piezoelectric crystal assemblies will, of course, be further described hereinafter with reference to currently preferred embodiments thereof. By way of brief initial summarization, however, it may be noted that the improved crystal assembly involves a small disc-like piezoelectric element of quartz material adapted to operate in a thickness shear mode having metallic electrode structures deposited upon the central piezoelectrically active areas of the major faces of the element and extended radially outwardly from such areas to provide points for making electrical connection therewith, a pair of electrically conductive leads having bifurcated clamping portions formed at one end thereof and connected with the tab portions of the electrode structures adjacent the circumferential edge of the crystal element, cooperating top and bottom pan-like cover members fitted together with the crystal element held therebetween along an outer marginal zone of the crystal, and optionally but preferably, a layer of hardened epoxy material forming an outer sealing and protective encapsulation for the assembly with the electrical connection leads protruding therefrom.

The improved method is somewhat more difficult to summarize, but includes temporarily supporting a plurality of pairs of connection lead wires along the length of a carrier, securing a crystal element to each pair of such leads with the latter continuing to be supported by the carrier, performing various required operations upon the crystal elements while so supported, preforming the top and bottom pan-like cover members in strips of the material from which they are fabricated but temporarily leaving the same attached to such strips, juxtapositioning the strips with the carrier in such manner as to align a top member and a bottom member with each of the crystal elements respectively and with the elements between such pairs of members, completing the interconnection of the top members with the bottom members and the removal of the same from the strips from which they were initially formed, and dipping and curing of the otherwise completed assemblies to provide an epoxy encapsulation thereon prior to removal of the then completed crystal assemblies from the mentioned carrier by which they were supported throughout the process of assembling the same. The association of a plurality of the assemblies with a common supporting carrier throughout the various stages of assembly thereof permits various steps of the method to be performed concurrently upon all of the assemblies supported by the carrier, while others can be efficiently performed through indexing of the carrier relative to a processing stage that may most desirably act upon the crystal elements or assemblies in sequential fashion.

BRIEF DESCRIPTION OF THE DRAWINGS

FIGS. 4 through 21 show various stages of fabrication and assembly of parts in accordance with the currently preferred method of manufacturing the assembly of FIG. 1. More specifically.

DESCRIPTION OF THE PREFERRED EMBODIMENTS

It should be understood that the currently preferred piezoelectric crystal assembly construction chosen for illustrating the apparatus aspect of the invention could manifestly be fabricated and assembled in a more conventional manner not utilizing the improved method aspects of the invention nor fully realizing the benefits of the latter with respect to more efficient mass-production. Conversely, it should also be understood that at least a number of significant aspects of the improved method explained herein with reference to an illustrative currently preferred embodiment thereof applied to the manufacture of the preferred form of crystal assemblies also would have advantageous applicability in connection with the manufacture of piezoelectric crystal assemblies involving specifically different details of construction. Accordingly, although the improved method of the invention is the best manner now known in which to mass-produce the improved apparatus of the invention, it will be appropriate to consider certain aspects of each separately. The improved apparatus provided by the invention will be considered first.

Figures 1, 2:
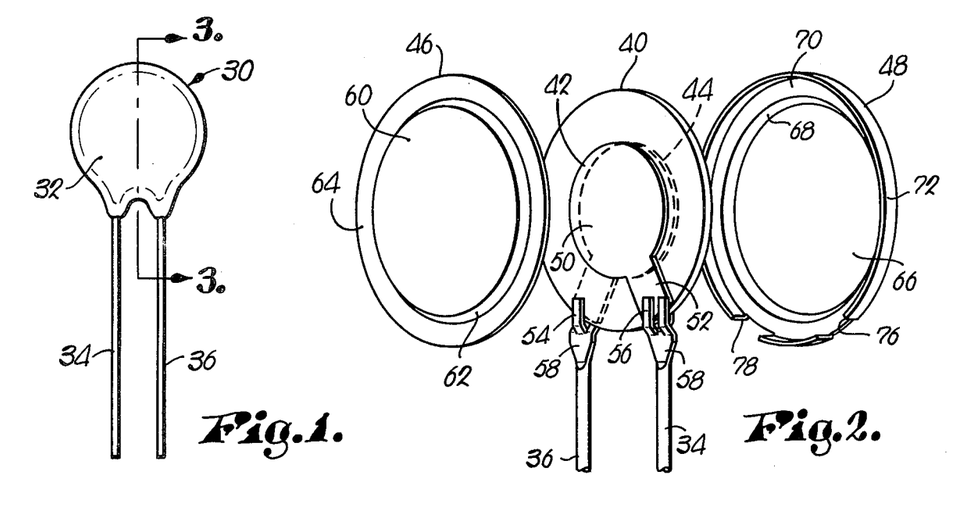
FIG. 1 is a side elevational view of a piezoelectric crystal assembly made according to the currently preferred construction and method contemplated by the invention.
FIG. 2 is an exploded perspective view of the crystal element, the connecting lead rods and the top and bottom cover members of the assembly of FIG. 1 in a disassembled condition and prior to final encapsulation.
Figures 3, 4, 5, 6:
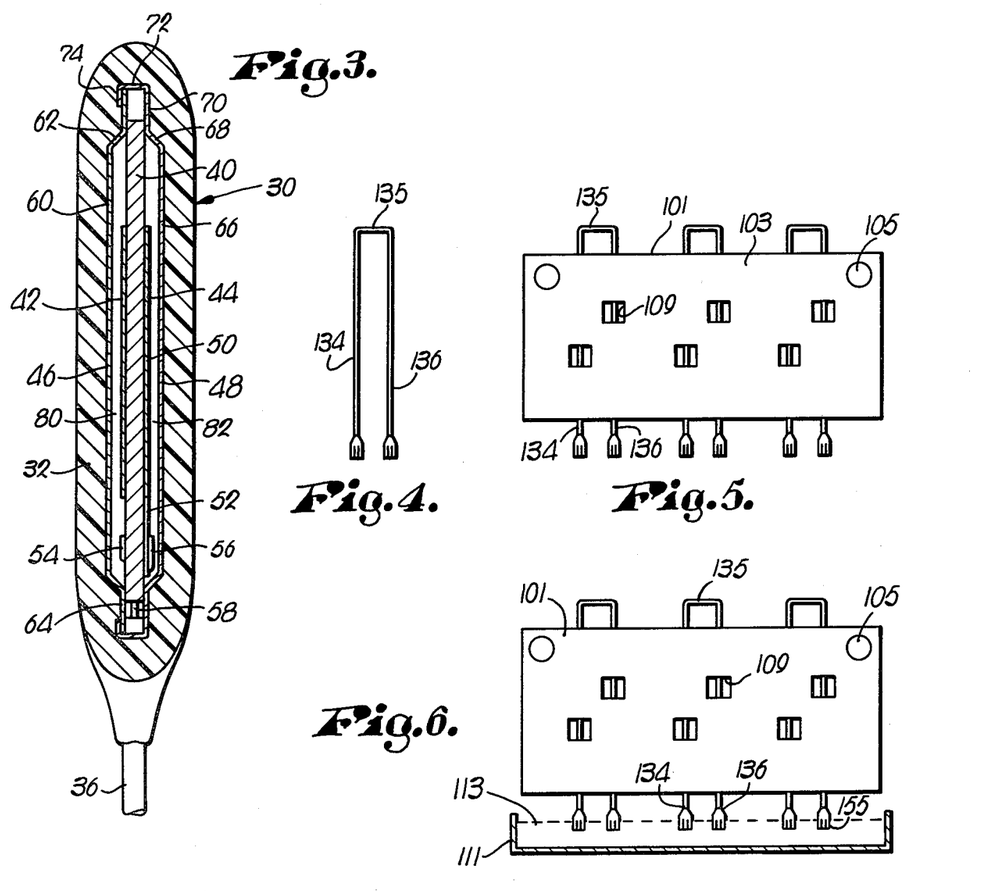
FIG. 3 is an enlarged central cross-sectional view of the assembly of FIG. 1 taken on line 3—3 of the latter.
FIG. 4 is a side elevational view showing the manner in which a pair of connection leads are initially fabricated as a unit.
FIG. 5 is a side elevational view showing how a plurality of the connection lead units are supported on a common carrier therefor.
FIG. 6 is a side elevational view showing the carrier being positioned for dipping the clamp ends of the connection leads into a conductive bonding paste.

Referring initially, therefore, particularly to FIGS. 1, 2 and 3, the currently preferred embodiment of the improved piezoelectric crystal assembly is generally designated 30. As shown in FIGS. 1 and 3, the assembly 30 externally manifests only an outer encapsulation cover 32 and a pair of electrical connection leads 34 and 36 protruding therefrom, the entire assembly 30 being of about the size and having about the same general external configuration as a small ceramic capacitor.

As shown in FIGS. 2 and 3, the assembly 30 internally includes a disc-like piezoelectric crystal element 40, electrode structures 42 and 44 respectively affixed to the opposed major faces of the crystal element 40, and a pair of peripherally interconnected cover members 46 and 48 enclosing the crystal element 40 in supported relationship therebetween. Those parts, together with the leads 34 and 36 and the outer cover 32, comprise the sole primary components of the improved assembly 30, further details of which will next be discussed.

The crystal element 40 is circular, is preferably quartz, is preferably of the "AT-cut", "BT-cut", "SC-cut" or similar type adapted to vibrate piezoelectrically in a high frequency thickness shear mode, and may typically be of a diameter of about 0.4 inch and of a thickness of the order of 0.015 inch (depending upon the resonance frequency desired). If desired to adapt the assembly 30 for use in higher power circuit applications, the diameters of the element 40 and the other parts may be appropriately increased, in which event a marginal portion of both major faces of the element 40 adjacent the circumferential edge thereof will preferably be bevelled in the conventional manner to assure that the element 40 is engaged by the members 46 and 48 only at areas which are sufficiently nodal as not to significantly interfere with or damp the desired mode of piezoelectric vibrations.

The electrode structures 42 and 44 are conventionally formed upon and affixed to the opposite major faces of the element 40 by vacuum deposition or other known techniques and may be of silver or other electrically conductive metals commonly employed for such purpose. Each of the electrode structures 42 and 44 includes a circular central portion 50 covering the piezoelectrically most active central area of the corresponding face of the element 40 and a connection tab portion 52 extending outwardly from the central portion onto a minor segment of the outer annular zone of such face of the element 40, in the manner that has now become common practice and is best shown in FIG. 2, it being noted that the tab portions 52 of the electrode structures 42 and 44 are angularly displaced from each other to facilitate connection of the leads 36 and 34 therewith in the manner hereinafter more fully described. The structures 42 and 44 are, of course, very thin, typically of the order of less than 0.001 inch.

The leads 34 and 36 are formed of electrically conductive wire, such as 26 gauge copper bus wire, and are provided at the end thereof to be connected to the element 40 with bifurcated clamps having opposed clamping fingers as at 54 and 56, which may be fabricated by flattening an end portion of the lead as at 58 and then stamping and bending same to provide the fingers 54 and 56. As best shown in FIG. 2, the clamping fingers 54 and 56 of each lead 34 and 36 extend from the edge of the element 40 into positions of opposed engagement with parts of the outer zone of the opposite major faces of the element 40 and, more particularly, the clamping fingers of each of the leads 34 and 36 engage those minor segments of such zone which are covered by the tab 52 of the corresponding electrode structure 42 or 44 so as to effect electrical connection with the latter as well as physical connection with the element 40. An electrically conductive paste will preferably be applied to each of such connections of the leads 34 and 36 with the element 40 and then heat cured to assure that such connections are effective and permanent.

The cover members 46 and 48 are preferably both formed of aluminum foil about 0.0025 inch thick and are anodized with conventional techniques after shaping. When such material is anodized, all of the exposed surfaces thereof are covered with a layer of aluminum oxide, which is both extremely inert and exhibits very effective electrical insulating properties to conductors touching the same and carrying electrical signals of the type and magnitude normally associated with the operation of the assemblies 30. Shaping of the members 46 and 48 is most conveniently accomplished by die stamping, and, as subsequently noted in connection with the improved method, a plurality of such members may be efficiently stamped in strips of the above-mentioned foil material.

The cover member 46, which may be thought of as the "top" cover member, is of generally pie-pan-like configuration and includes a flat circular central portion 60, a laterally angled annular intermediate portion 62, and a planar outwardly extending annular portion 64, an inner annular part of the latter being in engagement with the outermost annular part of the face of the element 40 carrying the electrode structure 42.

The cover member 48, which may be thought of as the "bottom" cover member, is generally similar to cover member 46 and includes a flat circular central portion 66, a laterally angled annular intermediate portion 68, and a planar outwardly extending annular portion 70, but also includes a laterally extending annular flange portion 72 (of which the distal margin 74 is crimped or otherwise bent inwardly back over a part of the outwardly extending portion 64 of the member 46 to interconnect the members 46 and 48 with the element 40 therebetween). When the members 46 and 48 are thus assembled, it will be seen that the element 40 is positively supported by opposite engagement of an outermost annular part of each of its major faces with an annular inner part of the portion 64 of the member 46 and of the portion 70 of the member 48 between which it is disposed and held.

With a crystal element 40 of the previously mentioned dimensions, the member 46 may have an outer diameter of about 0.455 inch with a lateral offset between the planes of its portions 60 and 64 of about 0.012 inch and a radial width for its portion 64 of about 0.040 inch; and the member 48 may have an outer diameter of about 0.460 inch, the same lateral offset for its portions 66 and 70 as for the portions 60 and 64 of the member 46, the same width for its portion 70 as for the portion 64 of the member 46, and a width for its flange 72–74 of about 0.030 inch. The flange 72–74 is preferably notched as at 76 and 78 to provide clearance for the leads 34 and 36.

The spaces between the element 40 and each of the central portions 60 and 66 of the members 46 and 48 present thin chambers 80 and 82, which may preferably be filled with a very inert gas such as nitrogen (or with air if desired) by assembling the cover members 46 and 48 within an appropriate atmosphere.

The outer protective encapsulation covering 32 upon the assembly 30, although conceivably optional for some applications, is preferably utilized and may be formed by preheating the other parts of the assembly 30 to about 300° F., dipping the same in an epoxy powder such as Type EPU-42 available on the market from The Morton Company, and then curing the same at about 250° F. for about one hour.

When thus fabricated and assembled, the piezoelectric crystal assembly 30 is believed to be a significant improvement over anything heretofore available for the same purposes. As should now have become clear, its advantages are attributable not only to the nature and arrangement of the structures it employs, but also to the structures they render it feasible to omit, while still realizing enhanced results.

Turning attention now to the improved method of making piezoelectric crystal assemblies, such as, but not limited to, those just above described, reference is made to FIGS. 4 through 22.

FIG. 4 shows an improved manner of preforming pairs of connecting leads 134 and 136 for crystal assemblies as an integral loop having an interconnecting bight 135, which can be cut away when no longer needed. Such initial construction of the lead pair as a unit assembly 134-135-136 facilitates handling of such leads, maintaining them in a desired relationship to each other during interconnection thereof to a crystal element, and supporting a plurality of same upon a carrier 101 common thereto, as illustrated in FIG. 5.

Although FIGS. 5 through 8, 11 through 14, and 20 through 22 illustrate pluralities of only three of the involved types of items, it should be understood that such items would preferably be handled in significantly larger groups. Thus, the carrier 101 appearing in FIG. 5 would typically be dimensioned to support a considerably larger number of the lead units 134-135-136 that depicted. The carrier 101 may be formed from an upper strip 103 of plastic material that will not "out gas" in a vacuum detachably mounted as by screws 105 atop a base strip 107 (see FIG. 9) of similar material and preferably provided with transverse grooves (not shown) in its upper surface for the purpose of receiving the leads 134 and 136 of the units 134-135-136 in predetermined locations. The upper strip 103 is preferably provided with apertures 109 above each of the mentioned grooves in the base strip 107 to facilitate making electrical connections with the leads 134 and 136 during a subsequent phase of the manufacturing process. The base strip 107 may also be provided with a series of holes (not shown) for use in accurately locating or indexing the carrier 101 relative to stations where processing operations are to be performed. Once the carrier 101 is assembled with a plurality of the lead units 134-135-136 arranged as illustrated, such units will remain positively supported in their predetermined relationships to each other and the carrier 101 until the latter is disassembled to release them.

FIG. 6 illustrates the step of placing the carrier 101 supporting a plurality of the units 134-135-136 into juxtaposition with a vessel 111 containing a conductive bonding paste 113, such as silver powder mixed in heat curable epoxy material, to immerse and coat the distal clamping finger structures 155 of the leads 134 and 136 with such paste 113.

Figure 7:
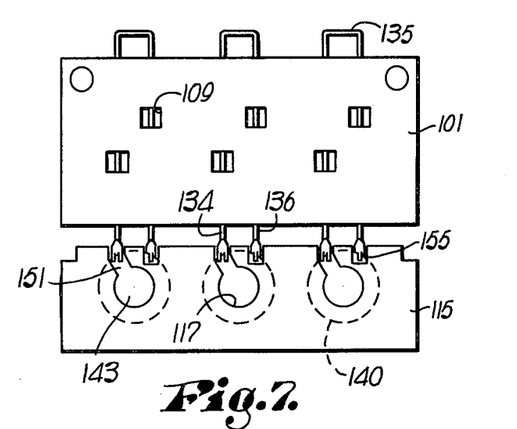
FIG. 7 is a side elevational view showing how a plurality of crystal elements having deposited electrode structures thereon and carried in predetermined relationship to each other along a support strip to which they are temporarily adhered are brought into concurrent juxtaposition with the clamp ends of corresponding pairs of leads for securing the crystal elements to the connection lead units.

FIG. 7 depicts the manner in which a plurality of crystal elements 140, preformed with electrode structures 143 thereon, are temporarily supported by a pair of masking strips 115 (of which only the proximate one is shown) on either side thereof and to which the elements 140 are adhesively attached at predetermined intervals, and the way in which the elements 140 may thus be moved as a group into juxtaposition with the carrier 101 for aligning each of the elements 140 and the electrode structures 143 thereon with the clamping fingers 155 of a corresponding pair of the leads 134 and 136, which are coated with the conductive paste material 113. Actually, FIG. 7 also suggests how the electrode structures 143, and particularly the tab portions 151 thereof may be accurately positioned in the elements 140 during preforming, in that, the masking strips 115 are provided with a series of accurately located and appropriately shaped notches 117 through which the electrode materials may be deposited upon the faces of a plurality of the elements 140 during preforming thereof. Alternatively, if the elements 140 are available with the electrode structures 143 already preformed thereon, only a single support strip 115 may be used, to which such elements 140 will be temporarily adhered in appropriate predetermined positions.

Figure 8:
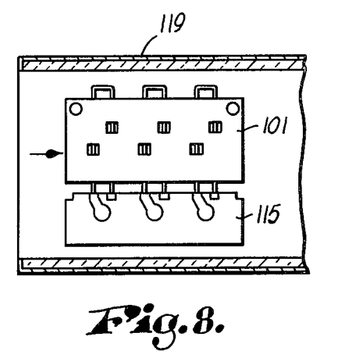
FIG. 8 is a view partially in side elevation and partially in cross section of the parts shown in FIG. 7 disposed within a curing oven to harden the conductive paste upon the clamp portions of the leads for completing the securement of the crystal elements to the latter.

FIG. 8 shows the carrier 101, the masking strips 115 and the leads 134, 136 and elements 140 respectively supported thereby being processed in above noted juxtaposition thereof within a tunnel oven 119 to cure the paste 113, thereby permanently physically connecting each element 140 with a corresponding lead unit 134-135-136 and electrically coupling each of the leads 134 and 136 with the tab portion 151 of a corresponding electrode structure 143, after which the masking strips 115 are removed from the elements 140 (which are then supported by the carrier 101).

Figure 9:
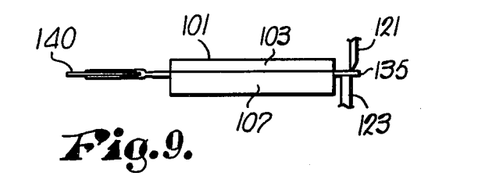
FIG. 9 is a side elevational view showing the cutting away of the extraneous bight portion of each of the connection lead units.

Before frequency testing and adjustment may be carried out on the elements 140, it is necessary that the electrical coupling between the leads 134 and 136 theretofore inherent in the presence of the bight 135 must be eliminated. This is shown in FIG. 9 as being accomplished by a shear 121 and cooperating shear block 123 for concurrently cutting away the bights 135 associated with the elements 140 being supported by the carrier 101.

Figure 10:
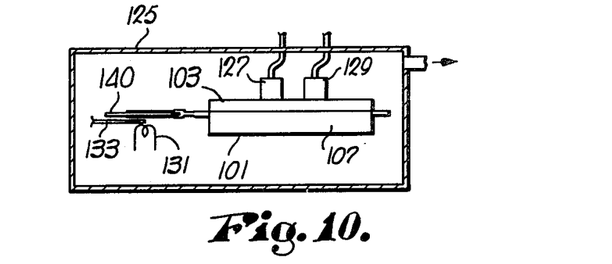
FIG. 10 is a view partially in side elevation and partially in cross section depicting the manner in which final adjustment and testing of the operating frequency of the crystal elements is accomplished.

FIG. 10 depicts frequency, testing and adjustment being carried out within a vacuum box 125, with test lead probes 127 and 129 shown as coupled with the leads 134 and 136 via the apertures 109 provided for that purpose in the upper carrier strip 103 (see: FIG. 5), and with conventional heating means 131 and metallic (or iodine) source material 133 disposed for depositing sufficient additional material upon one of the electrodes 143 of the elements 140 for adjusting the resonance frequency thereof to the desired value in accordance with known techniques.

Figures 11, 12, 13, 14, 15:
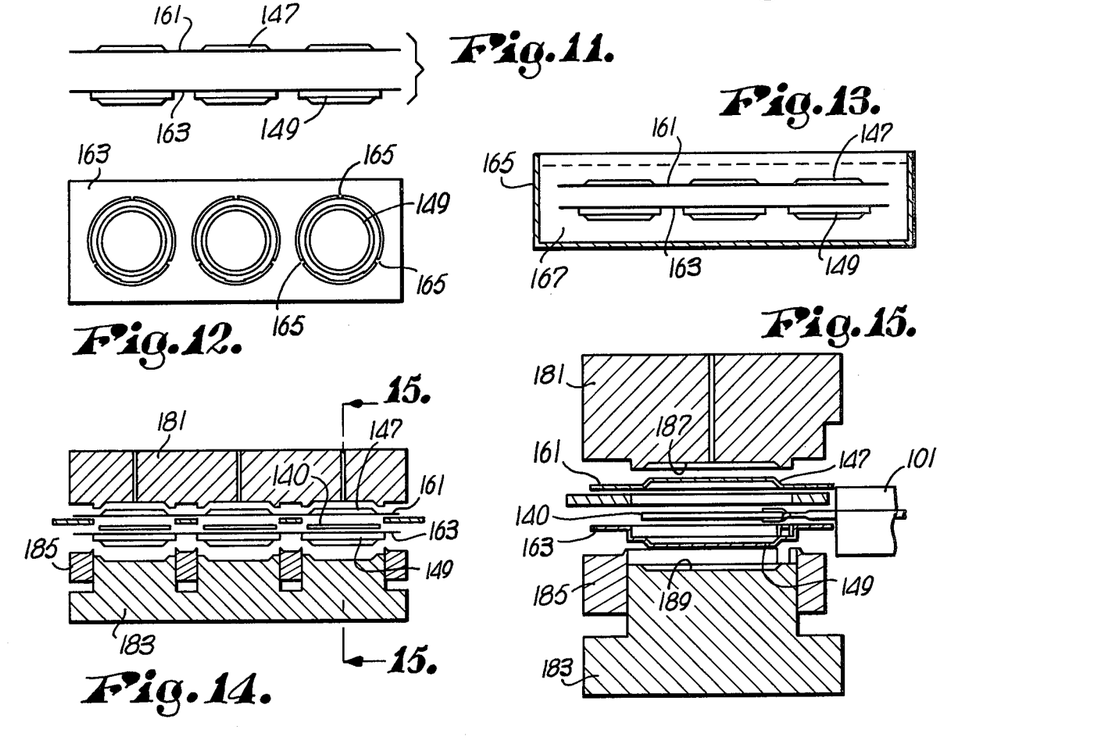
FIG. 11 is a side elevational view showing the manner in which the top and bottom cover members are formed by stamping in respective strips carrying pluralities thereof positioned to align with the positions of the crystal elements, as supported by the common carrier for the latter.
FIG. 12 is a plan view showing the strip in which the bottom cover members are formed.
FIG. 13 is a view partially in side elevation and partially in cross section showing the aluminum foil strips in which the top and bottom cover members are formed being immersed in an anodizing bath.
FIG. 14 is a cross sectional view depicting the manner in which the top and bottom cover members may be concurrently brought into properly aligned position with a plurality of corresponding crystal elements for holding and enclosing the latter.
FIG. 15 is a cross sectional view taken on line 15—15 of FIG. 14.

FIG. 11 depicts in elevation an aluminum foil strip 161 in which a plurality of top cover members 147 have been formed at predetermined intervals, as by die stamping, and also depicts a similar strip 163 in which a plurality of bottom cover members 149 have been similarly formed. The strip 163 is also shown in plan view in FIG. 12, from which it may be noted that, although the peripheries of the formed members 149 are largely severed from the strip 163, attachment bridges are left as at 165 for temporarily retaining the members 149 on the strip 163; and the members 147 are similarly temporarily retained on the strip 161.

FIG. 12 shows the strips 161 and 163 being immersed in a tank 165 containing a solution 167 for anodizing the members 147 and 149.

FIGS. 14 and 15 depict a plurality of the elements 140 supported by a common carrier 101 being respectively juxtaposed between corresponding pairs of members 147 and 149 respectively carried by strips 161 and 163, all in further aligned juxtaposition with and between an upper plural cavity die 181 and a lower plural cavity die 183 that will be used in further forming and assembly operations. The die 183 is provided with shears 185 for completing the severance of the members 147 and 149 from the strips 161 and 163 respectively when the dies 181 and 183 are closed.

Figure 16:
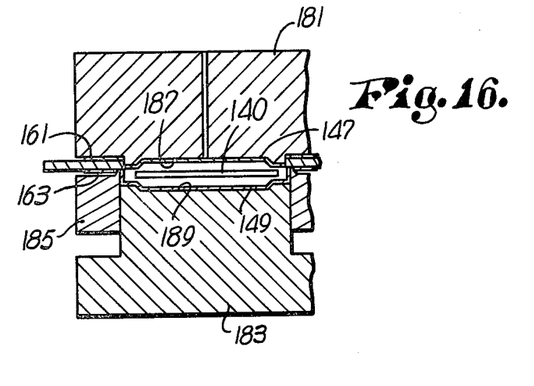
FIG. 16 is a cross sectional view depicting the severance of a top cover member from the strip in which it was formed and the seating thereof within the corresponding bottom cover member with a crystal element therebetween.

FIG. 16 depicts the dies 181 and 183 closed to precisely align the members 147 and 149 in the cavities 187 and 189 thereof and the shears 185 being operated to fully separate the members 147 and 149 from the strips 161 and 163.

Figure 17:
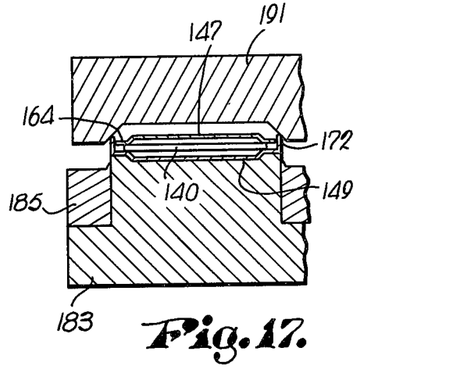
FIG. 17 is a cross sectional view illustrating the cover members in position for the initial crimping operation upon the flange of the bottom member.
Figure 18:
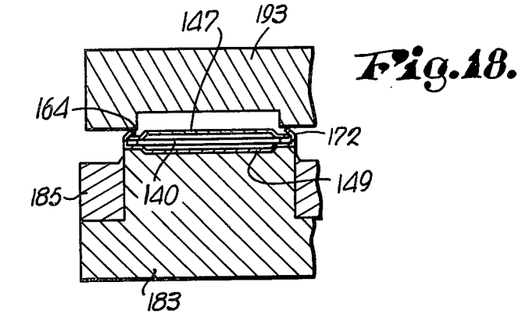
FIG. 18 is a cross sectional view illustrating the cover members in position for the final crimping operation.
Figure 19:
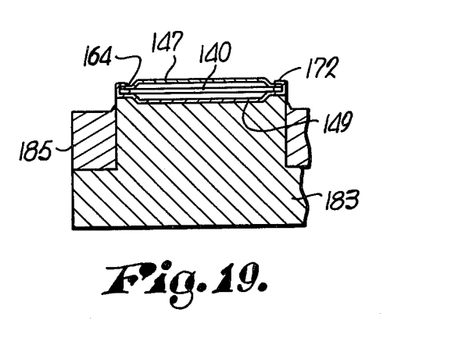
FIG. 19 is a cross sectional view showing a crystal element in its final disposition within a corresponding pair of fully crimped cover members.

FIGS. 17 and 18 depict the successive employment of upper crimping dies 191 and 193 to successively bend and firmly crimp the flange portion 172 of the members 149 into overlying engaging relationship with the annular outer portion 164 of the members 147, thereby interconnecting each pair of members 147 and 149 with a corresponding element 140 supported and held therebetween adjacent its nodal margin. FIG. 19 depicts the completion of these operations with the die 193 withdrawn, it being understood that the plurality of sets of associated elements 140 and members 147 and 149 thus far assembled will still be supported by the carrier 101 common thereto, with the pairs of leads 134 and 136 respectively associated therewith extending away from the viewer in the direction of the carrier 101 (which, to avoid undue cluttering, is not shown in the background of FIGS. 16 through 19).

Figure 20:
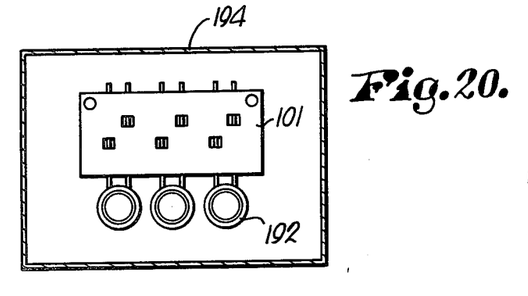
FIG. 20 is a view partially in cross section and partially in elevation showing a number of the crystal elements carried by the common carrier within respective crimped cover member pairs being preheated in an oven prior to final encapsulation.
Figure 21:
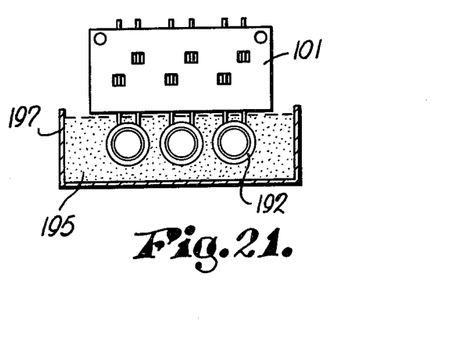
FIG. 21 is a view partially in cross section and partially in side elevation showing the preheated assemblies being dipped into powdered epoxy material to be adhered thereto for encapsulation purposes.
Figure 22:
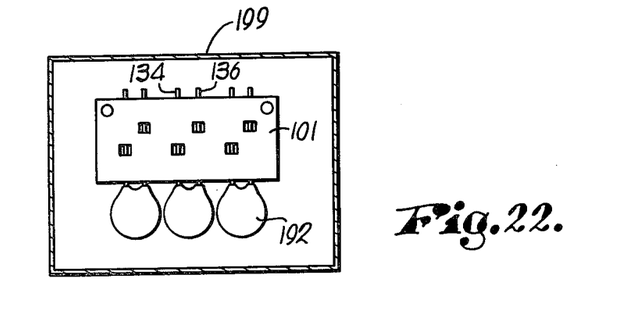
FIG. 22 is a view partially in cross section and partially in side elevation showing the assemblies from FIG. 21 being cured in a heating oven to harden the epoxy encapsulation coverings thereon.

FIG. 20 shows a plurality of the thus far completed assemblies 192 supported by the carrier 101 and being preheated in an oven 194 prior to dipping of the assemblies 191 into epoxy encapsulating material 195 within a container 197, as shown in FIG. 21. FIG. 22 shows the carrier 101 and the assemblies 192 supported thereby, to the latter of which epoxy encapsulating material 197 is adhering, disposed within a curing oven 199 for curing the material 195 into a hardened encapsulation covering the entirety of the assemblies 192 except for the leads 134 and 136 protruding therefrom.

With the processing thus completed, the fully manufactured products thus produced will be of the nature previously described with reference to the preferred form of piezoelectric crystal assembly 30 (or of such differing nature as may result from changes made by the user in the construction of the crystal assembly to whose fabrication and assembly the method of the invention is applied).

It will be perceived that the improved method provided by the invention presents many advantages from the standpoint of efficiency and economy, as well as uniformity of the products manufactured therewith, as compared with conventional prior techniques for making piezoelectric crystal assemblies.

It will be understood by those skilled in the art, however, that various minor modifications could be made from the preferred embodiments of the improved apparatus and method provided by this invention, without significantly departing from the gist and essence of the invention. Accordingly, the invention should be deemed limited only by the fair scope of the claims which follow when construed to encompass manifest mechanical equivalents.

I claim:
1. A piezoelectric crystal assembly comprising:
   a substantially circular, disc-like, quartz, piezoelectric crystal element of a type which vibrates in a thickness shear mode and having a pair of opposite, major faces,
   each of said faces including a substantially circular, central area and a substantially annular, outer zone,
   each of said zones including a major segment and a minor segment,
   said minor segments being angularly displaced from each other in a direction around said element;
   a first, electrically conductive, electrode structure secured to one of said faces in engaging, substantially covering relationship to said central area and said minor segment of said outer zone of said one face;
   a second, electrically conductive, electrode structure secured to the other of said faces in engaging, substantially covering relationship to said central area and said minor segment of said outer zone of said other face;

a first, substantially circular, cover member having a central portion in spaced relationship to said central area of said one face of said element, an intermediate portion extending laterally from said central portion of said first member toward said outer zone of said one face of said element, and a substantially annular, outer portion extending outwardly from said intermediate portion of said first member and beyond the periphery of said element, said outer portion of said first cover member having an electrically non-conductive face in engaging, supporting relationship with a substantially annular, marginal part of said outer zone of said one face of said element;

a second, substantially circular, cover member having a central portion in spaced relationship to said central area of said other face of said element, an intermediate portion extending laterally from said central portion of said second member toward said outer zone of said other face of said element, and a substantially annular, outer portion extending outwardly from said intermediate portion of said second member and beyond the periphery of said element, said outer portion of said second cover member having an electrically non-conductive force being in engaging, supporting relationship with a substantially annular, marginal part of said outer zone of said other face of said element;

means for positively interconnecting said members and holding said members in said relationship thereof to said element for supporting said element between said members;

means for effecting respective electrical connections from outside said members to the part of each of said electrode structures disposed upon said minor segment of said outer zone of the corresponding of said faces; and sealing means in protective covering relationship to said members.

2. An assembly according to claim 1, wherein:

there is a chamber of lesser thickness than said element between the part of said electrode structure covering said central area of each of said faces and said central and intermediate portions of the corresponding of said members.

3. An assembly according to claim 2, wherein: said chambers contain a substantially inert gas.

4. A piezoelectric crystal assembly comprising:

a substantially circular, disc-like, quartz, piezoelectric element having a pair of opposite, major faces, each of said faces including a substantially circular, central area and a substantially annular, outer zone, each of said zones including a major segment and a minor segment, said minor segments being angularly displaced from each other in a direction around said element;

a first, electrically conductive, electrode structure secured to one of said faces in engaging, substantially covering relationship to said central area and said minor segment of said outer zone of said one face;

a second, electrically conductive, electrode structure secured to the other of said faces in engaging, substantially covering relationship to said central area and said minor segment of said outer zone of said other face;

a first, substantially circular, cover member having a central portion in spaced relationship to said central area of said one face of said element, an intermediate portion extending laterally from said central portion of said first member toward said outer zone of said one face of said element, and a substantially annular portion extending outwardly from said intermediate portion of said first member and having an electrically non-conductive force in engaging relationship with a substantially annular, marginal part of said outer zone of said one face of said element;

a second, substantially circular, cover member having a central portion in spaced relationship to said central area of said other face of said element, an intermediate portion extending laterally from said central portion of said second member toward said outer zone of said other face of said element, and a substantially annular portion extending outwardly from said intermediate portion of said second member and having an electrically non-conductive force in engaging relationship with a substantially annular, marginal part of said outer zone of said other face of said element;

means for positively interconnecting said members and holding said members in said relationship thereof to said element for supporting said element between said members, said interconnecting and holding means including flange means on said second member extending initially laterally from said annular portion of said second member outside the peripheral edge of said annular portion of said first member and thence being bent into engaging relationship with the surface of said annular portion of said first member remote from said element; and means for effecting respective electrical connections from outside said members to the part of each of said electrode structures disposed upon said minor segment of said outer zone of the corresponding of said faces.

5. An assembly according to claim 4, wherein: said element is formed of AT-cut quartz.

6. An assembly according to claim 5, wherein: said element is of type adapted for piezoelectric vibration in a thickness shear mode.

7. An assembly according to claim 4, wherein: said central portions of said members are substantially circular, and said intermediate portions of said members are substantially annular.

8. An assembly according to claim 7, wherein: said central portions of said members are substantially planar and substantially parallel to each other.

9. An assembly according to claim 4, wherein: said members are formed of aluminum foil material.

10. An assembly according to claim 9, wherein: said material is anodized to render the exposed surfaces of said members electrically substantially non-conductive.

11. An assembly according to claim 4, wherein: said means for effecting electrical connections comprises a pair of electrically conductive leads extending from outside said members between said annular portions of said members.

12. An assembly according to claim 11, wherein: the inner extremity of each of said leads is provided with bifurcated clamping means having fingers for respectively oppositely engaging said faces of said element.

13. An assembly according to claim 12, wherein:

one of said fingers of said clamping means of each of said leads engages said major segment of said outer zone of a corresponding of said faces, and another of said fingers of said clamping means of each of said leads engages the part of the corresponding of said electrode structures disposed upon said minor segment of said outer zone of the opposite of said faces.

14. An assembly according to claim 4, wherein:

there is provided sealing means in covering relationship to said members, said sealing means comprises a coating of hardened epoxy material, said holding means positively interconnects said members, said holding means comprises flange means on said second member extending initially laterally from said annular portion of said second member outside the peripheral edge of said annular portion of said first member and thence is bent into engaging relationship with the surface of said annular portion of said first member remote from said element, said element is formed of quartz, said element is of type adapted for piezoelectric vibration in a thickness shear mode, said central portions of said members are substantially circular, and said intermediate portions of said members are substantially annular, said central portions of said members are substantially planar and substantially parallel to each other, said members are formed of aluminum foil material, said material is anodized to render the exposed surfaces of said members electrically substantially non-conductive, there is a chamber of lesser thickness than said element between the part of said electrode structure covering said central area of each of said faces and said central and intermediate portions of the corresponding of said members, said chambers contain a substantially inert gas, said means for effecting electrical connections comprises a pair of electrically conductive leads extending from outside said members between said annular portions of said members, the inner extremity of each of said leads is provided with bifurcated clamping means having fingers for respectively oppositely engaging said faces of said element, one of said fingers of said clamping means of each of said leads engages said major segment of said outer zone of a corresponding of said faces, and another of said fingers of said clamping means of each of said leads engages the part of the corresponding of said electrode structures disposed upon said minor segment of said outer zone of the opposite of said faces.

* * * * *

UNITED STATES PATENT AND TRADEMARK OFFICE
CERTIFICATE OF CORRECTION

PATENT NO. : 4,431,937
DATED : February 14, 1984
INVENTOR(S) : Maurice Y. White

It is certified that error appears in the above-identified patent and that said Letters Patent is hereby corrected as shown below:

In Claim 1, Column 13, line 26, erase "force being", and substitute therefor -- face --.
In Claim 4, Column 14, lines 7 and 20, in each instance, erase "force", and substitute therefor -- face --.

Signed and Sealed this

Twenty-second Day of January 1985

[SEAL]

Attest:

DONALD J. QUIGG

Attesting Officer     Acting Commissioner of Patents and Trademarks